United States Patent [19]

Wang

[11] Patent Number: 5,583,746
[45] Date of Patent: Dec. 10, 1996

[54] HEAT SINK ASSEMBLY FOR A CENTRAL PROCESSING UNIT OF A COMPUTER

[75] Inventor: Michael Wang, Taipei Hsien, Taiwan

[73] Assignee: Tennmax Trading Corp., Taiwan

[21] Appl. No.: 560,930

[22] Filed: Nov. 20, 1995

Related U.S. Application Data

[63] Continuation-in-part of Ser. No. 354,438, Dec. 12, 1994, Pat. No. 5,502,619.

[51] Int. Cl.$^6$ ..................................................... H05K 7/20
[52] U.S. Cl. .......................... 361/697; 165/122; 165/185; 176/16.3; 257/718
[58] Field of Search ................................. 165/80.2, 80.3, 165/80.4, 185, 122; 174/16.3; 257/707, 713, 718–719, 726–727; 361/688, 694–697, 704, 717–718, 722; 415/175–178

[56] References Cited

U.S. PATENT DOCUMENTS

| | | | |
|---|---|---|---|
| 5,136,465 | 8/1992 | Benck et al. | 361/695 |
| 5,288,203 | 2/1994 | Thomas | 361/694 |
| 5,423,375 | 6/1995 | Chiou | 361/697 |

FOREIGN PATENT DOCUMENTS

| | | | |
|---|---|---|---|
| 0240111 | 10/1986 | Germany | 361/695 |

*Primary Examiner*—Gregory D. Thompson
*Attorney, Agent, or Firm*—Parkhurst, Wendel & Burr, L.L.P.

[57] ABSTRACT

A heat sink assembly for a central processing unit (C.P.U.) of a computer consists of a baseplate to which a fan is attached, a plurality of spacers, a corresponding plurality of plates, the spacers and plates each defining a central opening and being alternately stacked on the baseplate and surrounding the fan, thereby defining vents leading to a central passage defined by the central openings, and a cover plate defining a further central opening communicating with the central passage. The base plate, spacers, plates and cover plate are secured to each other by bolts and screws extending through holes defined therein. Clips can be received around the C.P.U., the baseplate and a lowermost plate to removably secure them together. Cool ambient air is drawn into the assembly unit by the fan via the vents, which then passes up the central passage, being warmed by heat originally generated by the C.P.U. to exit via the central opening of the cover plate thereby discharging excess heat from the heat sink assembly.

4 Claims, 5 Drawing Sheets

HEAT SINK ASSEMBLY FOR A CENTRAL PROCESSING UNIT OF A COMPUTER

CROSS-REFERENCES TO RELATED APPLICATIONS

This is a continuation-in-part application of U.S. Pat. Ser. No. 08/354,438 filed on Dec. 12, 1994, now U.S. Pat. No. 5,502,619.

FIELD OF THE INVENTION

The present invention relates to a heat sink assembly for a central processing unit, hereinafter referred to as "a computer chip", and, more particularly, to an improved heat sink assembly which is releasable from the computer chip.

DESCRIPTION OF RELATED ART

As the complexity of computer chips increases, the heat generated by those chips increases accordingly which can be harmful to the performance thereof. Thus, effective dissipation of such heat is essential and a variety of heat sinks have been devised for such purpose.

Although those types of design can provide the heat dissipation function well, a further improvement is found to increase the air flow through the heat sink. Yet a further improvement is to provide a means for releasably securing the heat dissipation unit to the computer chip.

SUMMARY OF THE INVENTION

The present invention provides a heat sink assembly for a computer chip which includes a baseplate with a bottom side secured to a computer chip and a top side to which a fan is removably secured, a combinative heat sink assembly comprising alternating layers of spacers and plates with vents defined therebetween and each spacer and plate further defining a large central opening, the spacers and plates being mounted to the top side of the baseplate surrounding the fan, a cover plate mounted to an uppermost plate and fixing means such as bolts which extend downwardly through the cover plate, the plates and the spacers to threadedly engage with the baseplate, whereby, as the fan rotates, cool, ambient air is drawn into the heat sink assembly via the vents between the spacers and plates and is urged upwardly through a passage defined by large central openings of the spacers and plates to exit via the cover plate and so discharge heat originally generated by the computer chip.

According to a first embodiment of the present invention, the spacers are substantially cross-shaped having a large central opening defined by a ring from which tips of the cross extend, the kips each defining a first through hole, and further having a small tab extending outwardly from the ring between each of two corresponding tips with a first tab hole defined therethrough. The plates are square and have a large central opening, a second through hole defined near each corner of the square and a second tab hole defined through each of four inwardly facing tabs which are equispaced between the respective second through-holes.

According to a second embodiment of the present invention, two notches are defined in each of two opposite edges of a lowermost square plate whereby four U-shaped clips each with a resilient tongue can be removably mounted over the computer chip, the baseplate and a lowermost cross-shaped spacer to removably retain the heat sink assembly to the computer chip.

According to a third embodiment of the present invention, the cover plate has two spars formed in the large central opening to which the fan can be mounted to an underside thereof.

It is an object of the present invention to provide a heat sink unit for a computer chip which provides improved cooling by a heat sink assembly.

It is a further object of the present invention to provide means for removably securing the heat sink assembly to the computer chip.

It is still a further object of the present invention to provide a cover plate to the heat sink assembly which has a means to which the fan can be mounted to an underside thereof.

DETAILED DESCRIPTION OF THE PREFERRED EMBODIMENT

Figure 1:
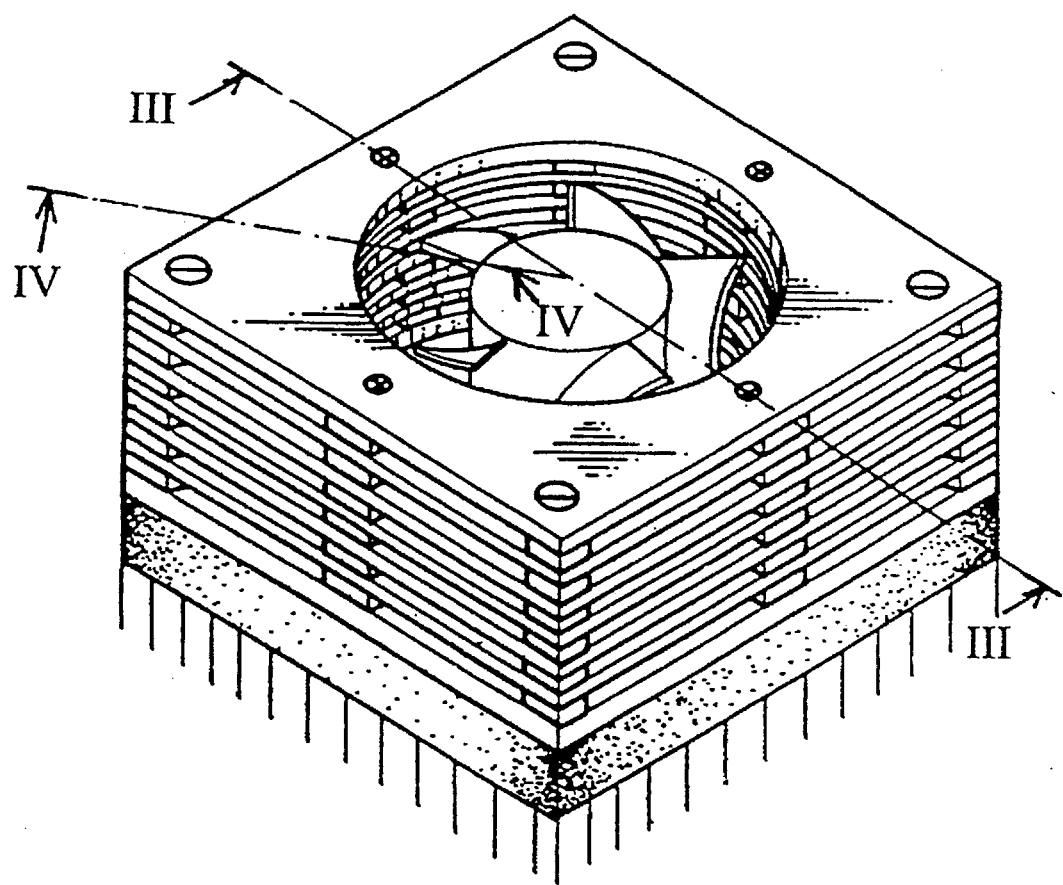
FIG. 1 is a perspective view of an embodiment a heat sink assembly for a computer chip in accordance with the present invention.
Figure 2:
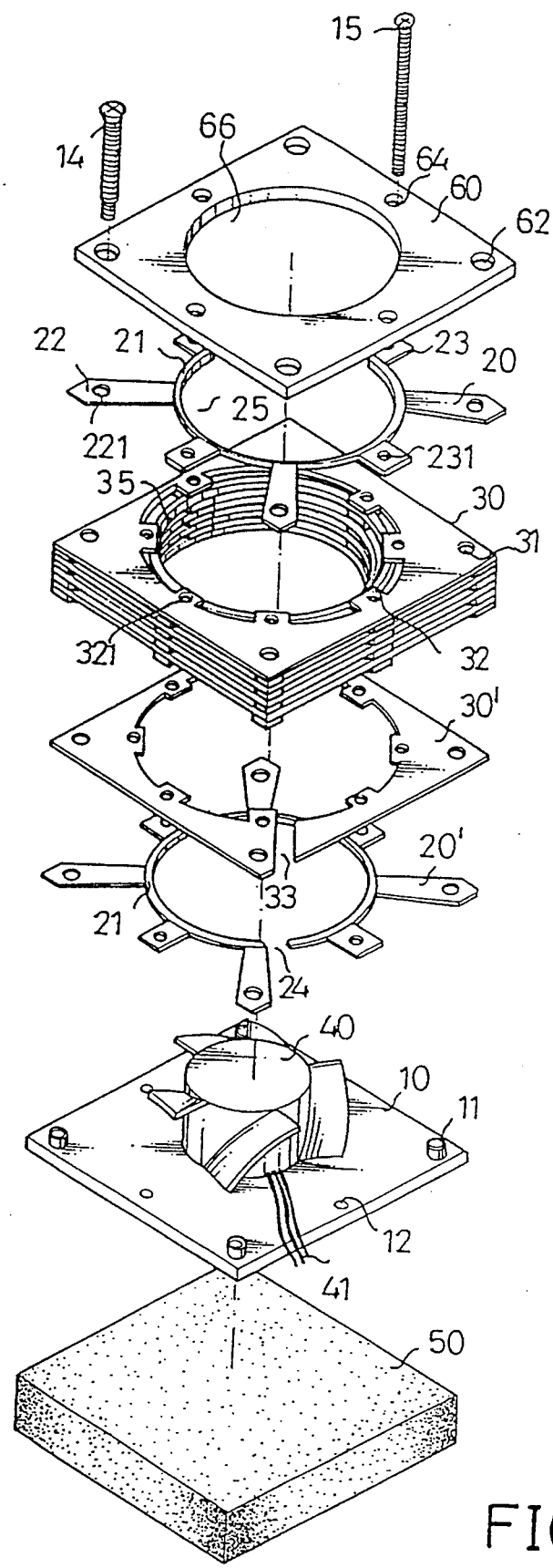
FIG. 2 is an exploded perspective view of a heat sink assembly in accordance with the present invention.

Referring to the drawings and initially to FIGS. 1 and 2, the heat sink assembly in accordance with the present invention generally includes a baseplate 10, a plurality of spacers 20, a corresponding plurality of square plates 30 inserted between the spacers 20 in an alternating manner, a fan 40, and a cover plate 60. A central processing unit 50 is provided under the baseplate 10.

The baseplate 10 securely and centrally receives the fan 40 on a top surface thereof, by means of an adhesive. Four tubular bosses 11 each respectively extends upwardly from the top surface of the baseplate 10 near each of four corners thereof. Each tubular boss 11 has a threaded bore extending to a bottom surface of the baseplate 10. Four threaded holes 12 are respectively defined on an edge of the baseplate 10 and between bosses 11.

Each spacer 20 has a large central opening 25 defined by a ring 21, four leap 22 radially and outwardly extend from the ring 21 and each having a first through-hole 221, and four a small tab 23 extending outwardly from the ring 21 between the leap 22 with a first tab hole 231 being defined therethrough.

Each square plate 30 has a large central opening 35, a second through-hole 31 defined near each corner thereof, and eight inwardly extending tabs 32 equispaced on a periphery of the central opening 35 and each define a second tab hole 321 therethrough.

It is to be noted that each second through-hole 31 of the square plates 30 has a diameter and position the same as of each corresponding first through-hole 221 of the spacer 22, each second tab through-hole 321 of the square plate 30 has a diameter and position the same as of each corresponding first tab hole 231 of the spacer 20 and the large opening 25 of the spacer 20 has a diameter smaller than that of the plate 30 but larger than a diameter across blades of the fan 40. A clearance spacer 20' has a gap 24 defined in the ring 21 to receive a wire 41 extending from the fan 40 to an electricity supply. A clearance square plate 30' has a gap 33 corresponding to the gap 24 of the spacer 20' to further receive the wire 41 so that when the clearance spacer 20' is mounted to the baseplate 10 and the clearance square plate 30' is accordingly mounted to the clearance spacer 20', the combined gaps 24, 33 provide a sufficiently large exit for the wire 41.

Alternating layers of the spacers 20 and the square plates 30 are assembled to the clearance spacer 20' and plate 30' to define a central passage wherein the fan 40 can be unobstructedly received. The square cover plate 60 has a large central opening 66, a third through-hole 62 defined near each corner thereof sized and positioned to align with the first and second through-holes 221, 31, and a fourth through-hole 64 is sized and positioned to align with the first and second tab holes 231, 321, such that, in assembly, securing elements such as bolts 14 can extend through the cover plate 60 via the third through-holes 62, the spacers 20 via the first through-holes 221, the square plates 30 via the second through-holes 31 to threadedly engage in the bosses 11 of the baseplate 10, and securing elements such as screws 15 extend through the cover plate 60 via the fourth through-holes 64, the spacers 20 via the first tab holes 231, the square plates 30 via the second tab holes 321 to threadedly engage with threaded holes 12 defined in the baseplate 10.

Figure 3:
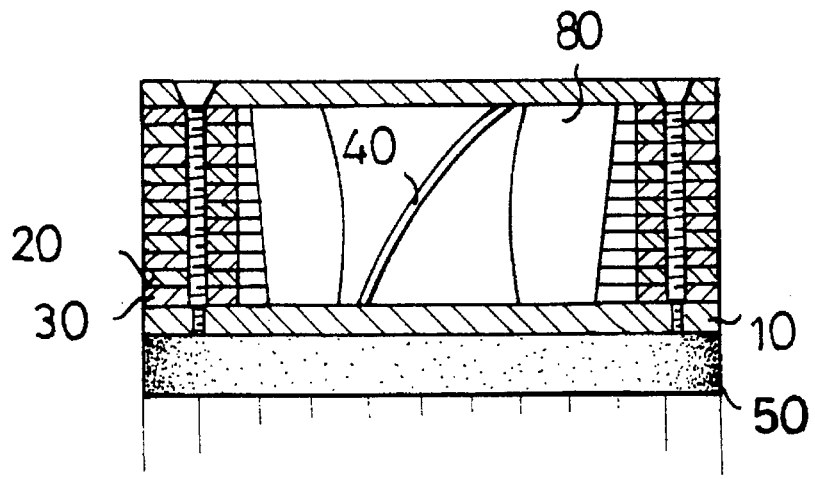
FIG. 3 is a cross-sectional view of a heat sink assembly in accordance with the present invention, taken along III—III as shown in FIG. 1.
Figure 4:
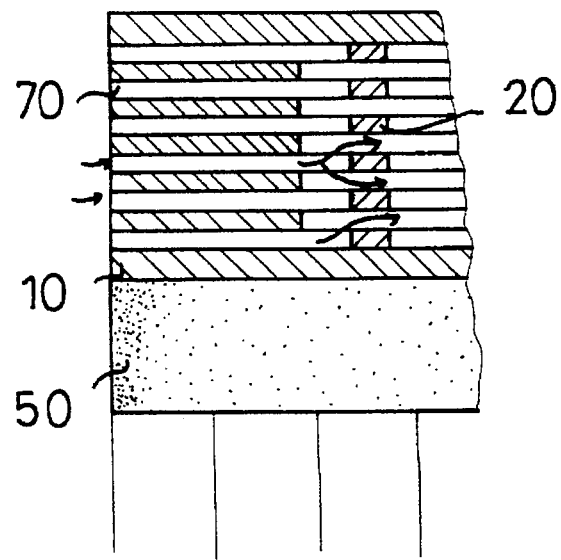
FIG. 4 is an enlarged cross-sectional fragmentary view of a heat sink assembly in accordance with the present invention taken along line IV—IV as shown in FIG. 1.

Thus, as seen in FIGS. 3 and 4, a plurality of vents 70 are defined between the square plates 30 and the spacer 20 and a central passage 80 extends upwardly from the base 10. Accordingly, as the fan 40 rotates, cool air can be drawn into the heat sink assembly via the vents 70 in the spacers 20 and square plates 30 thereby cooling the assembly which has absorbed heat from the computer chip 50, and as the air exits from the assembly via the central passage 80, excess heat is discharged from the assembly.

It is to be understood that all vents 70 defined between the spacers 20 and the plates 30 due to their different configurations enhance the heat dissipation of the assembly.

Figure 5:
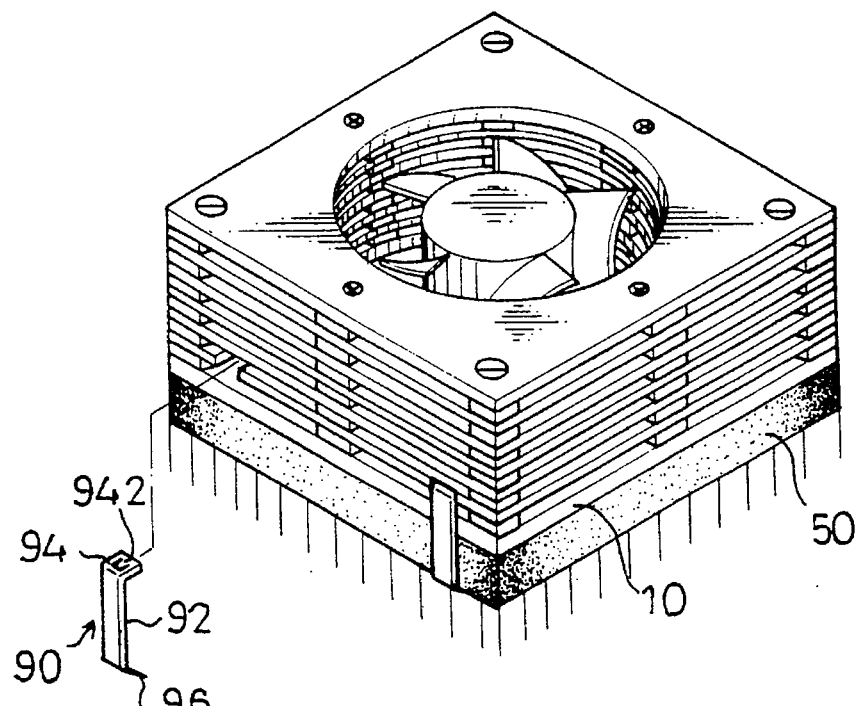
FIG. 5 is a perspective view of a heat sink assembly in accordance with a second embodiment of the present invention.
Figure 6:
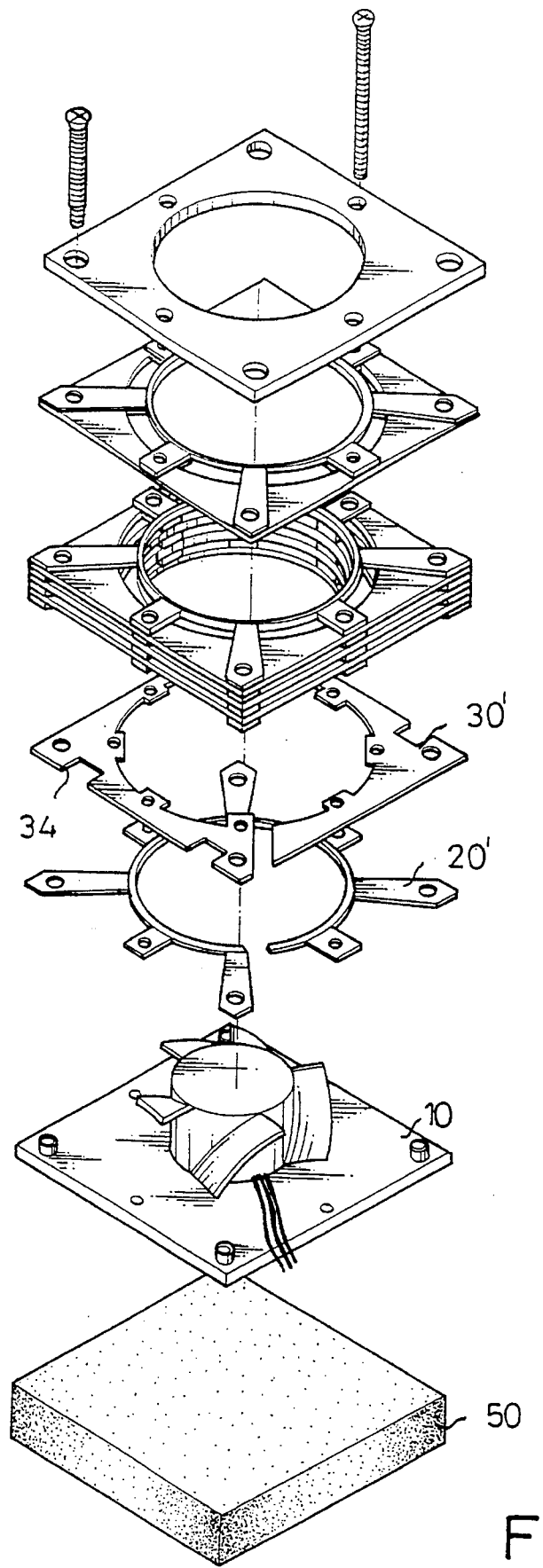
FIG. 6 is an exploded perspective view of a heat sink assembly in accordance with the second embodiment of the present invention.

Referring to FIGS. 5 and 6, in a second embodiment of the present invention, two opposite sides of the clearance square plate 30' each have two spaced-apart notches 34 defined in distal edges thereof. A clip 90 substantially U-shaped, has a vertical body 92, a first arm 94 and a second arm 96 both integrally and perpendicularly extending from corresponding distal ends of the vertical body 92. The first arm 94 has a resilient tongue 942 extending towards the second arm 96. The vertical body 92 has a length equal to the combined height of the chip, the base plate 10, and the clearance spacer 20' such that the clip 90 may snugly extend thereover, with the resilient tongue 942 urging downward on the baseplate 10 to removably secure the chip 50 to the heat sink assembly. Accordingly, if either the chip 50 or the heat sink assembly should become defective at a later stage, the functioning part can be retained and the faulty part discarded.

Figure 7:
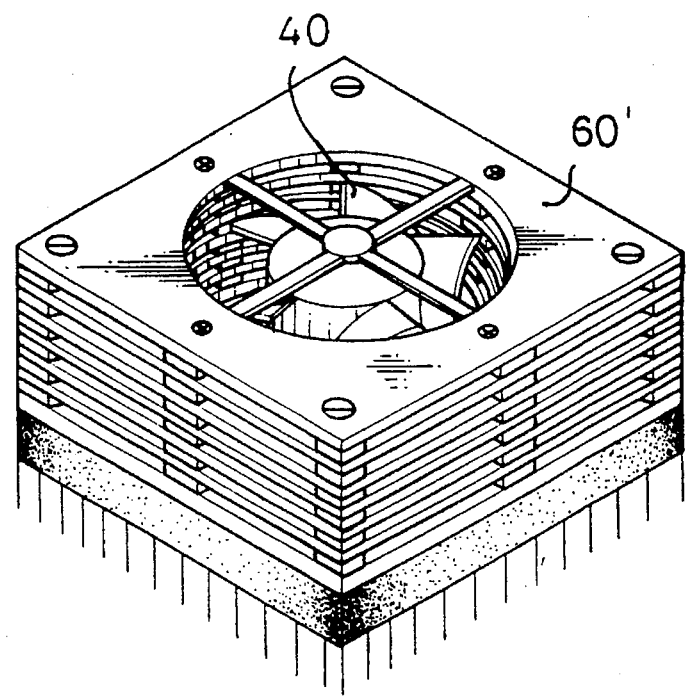
FIG. 7 is a perspective view of a heat sink assembly in accordance with a third embodiment of the present invention.

A third embodiment of the present invention is shown in FIG. 7 wherein a cover plate 60' has a cross-shaped central spar across the large opening and to which the fan 40 can be mounted to an underside thereof.

In a fourth embodiment of the present invention, the cross-shaped spacer 20 and the square plate 30 can be formed integrally as a single member.

Although the present invention has been explained in relation to its preferred embodiments, it is to be understood that many other possible modifications and variations can be made without departing from the spirit and scope of the invention as hereinafter claimed.

I claim:

1. A heat sink assembly for a central processing unit (C.P.U.) comprising:

a baseplate having a lower surface adapted to be engaged with a C.P.U. and defining a plurality of holes each defined by a threaded periphery;

a plurality of spacers each having a ring defining a central hole and a plurality of legs extending outward from the ring and each having a through-hole aligned with a corresponding threaded hole on the baseplate when the spacers are coincided with the baseplate;

a corresponding plurality of plates alternately inserted between the spacers and each defining a central opening having a diameter greater than an outer diameter of the ring of the spacer and a plurality of apertures such that the apertures are aligned with the through-holes on the spacers, the central openings of the plates being overlapped with the central holes of the spacers to define a passage when the spacers and the plates are assembled together;

a cover layer mounted on top of the assembled spacers and plates, said cover layer having a large central opening coinciding with said passage and a plurality of holes coinciding with the apertures on the plates;

a plurality of screws each respectively extending through a respective hole of the cover layer and aligned apertures and through-holes of the plates and spacers and threadably engaged with a threaded hole of the baseplate; and a fan securely mounted to the baseplate and located within the passage defined by the assembled spacers, plates, and cover layer for dissipating heat generated by the C.P.U.

2. The assembly as claimed in claim 1, wherein one of the plates further comprises a plurality of notches in edges of two opposite sides thereof.

3. The assembly as claimed in claim 2, further comprising a plurality of clips each having resilient tongue for insertion into a respective notch and engagment with the assembly.

4. The assembly as claimed in claim 1, wherein the cover layer includes a number of struts in the large central opening with which the fan can be securely mounted to an underside thereof.

* * * * *